(12) United States Patent
Dalal et al.

(10) Patent No.: US 6,553,522 B1
(45) Date of Patent: Apr. 22, 2003

(54) VALUATION OF TESTER ACCURACY

(75) Inventors: Wajih Dalal, Palo Alto, CA (US); Song Miao, San Jose, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/510,101

(22) Filed: Feb. 22, 2000

Related U.S. Application Data

(60) Provisional application No. 60/121,226, filed on Feb. 23, 1999.

(51) Int. Cl.$^7$ ................................................ G01R 31/28
(52) U.S. Cl. ...................................... 714/724; 324/73.1
(58) Field of Search ......................... 714/724; 324/754, 324/765, 73.1

(56) References Cited

U.S. PATENT DOCUMENTS 6,192,496 B1 * 2/2000 Lwarenence et al. ....... 714/724

OTHER PUBLICATIONS

Charoen et al., Adaptive Enhancement of Timing Accuracy and Waveform Quality in High–Performance IC Testers, 1992, IEEE vol. 39, No. 2, p. 139–151.*

Dahlberg, B., Increasing Test Accuracy by Varying Driver Slew Rate, 1991, IEEE, p. 44–48.*
Alcorn, B., Writing Correct and Usable Specifications for Board Test: A Case study, 1989, IEEE, p. 773–786.*
SEMI draft document #2928, Specification for overall digital timing accuracy, section 7.1 (SEMI G79–0200 Specification for Overall Digital Timing Accuracy, Semiconductor Equipment & Materials International, Mountain View, California, §7.1 (5 pages).

* cited by examiner

*Primary Examiner*—Albert Decady
*Assistant Examiner*—Shelly A Chase
(74) *Attorney, Agent, or Firm*—Bruce D. Riter

(57) ABSTRACT

Tester edge placement accuracy (EPA) is important for testing of semiconductor component devices. The value of that accuracy is quantified to the device manufacturer in terms of yield loss and bad parts sold as good parts (escapes in DPM). A simulation is presented that models the tester accuracy, the device edge distribution and their interaction for a example device having an operating speed of 800 Mbps. The same model can be applied for microprocessors or other parts that operate near the limits of ATE performance. In an example given, the estimated losses due to lack of appropriate tester accuracy are considerable: with the estimated yields and selling prices for the example device, the model shows a value of over $1 M for every 1 ps of enhanced tester edge placement accuracy.

13 Claims, 12 Drawing Sheets

| PARAMETER | VALUE | ACTUAL YIELD | COMMENTS |
|---|---|---|---|
| IDEAL YIELD | 95.00% | | EXPECTED PROCESS YIELD |
| ABSOLUTE LIMIT (ps) | 260 | | DATASHEET SPECIFICATIONS |
| ACCEPTABLE DPM | 300 | | ACCEPTABLE DPM |
| EPA1 (ps) | 80 | 69.12% | ATE1 ACCURACY |
| EPA2 (ps) | 50 | 83.26% | ATE2 ACCURACY |
| ASP OR PRICE PREMIUM ($) | 5 | | OR PRICE PREMIUM BETWEEN BINS |
| PARTS PER YEAR (MILLIONS) | 100 | CALCULATE YIELD | |
| TOTAL SAVING (MILLIONS) | 70.73001 | | |

FIG.12

VALUATION OF TESTER ACCURACY

Priority under 35 USC §119(e) of U.S. provisional application No. 60/121,226, filed Feb. 23, 1999 is hereby claimed, and the content of U.S. provisional application No. 60/121,226, filed Feb. 23, 1999 is incorporated herein by this reference.

BACKGROUND OF THE INVENTION

1. Field of the Invention

The invention relates to valuation of tester accuracy, in particular to quantitative measure of the effect of tester accuracy on yield and escapes for semiconductor components.

2. The Prior Art

Semiconductor component testers are used to test the performance of a device under test (DUT) under specified operating conditions, such as at a particular clock speed. The less accurate a tester is, the harder it is to tell whether a device under test (DUT) is capable of running at speed or not. This uncertainty increases when the DUT speed increases. The uncertainty has a probability of its own that is comprised of multiple parameters involving the DUT design, the DUT manufacturing process and the tester. For most applications, testers have been accurate enough to achieve credible judgements about the DUT speed. The price for misjudgment hasn't been very critical either. In the microprocessor world however, manufacturers could charge price premiums for their faster parts, which drives the needs for better tester accuracy in those markets. As memory interface standards evolve, the requirements for tester data rates and accuracy are increasing. Rambus Inc. of Mountain View, Calif. USA (Rambus) in particular is requiring speed three or more times the current testers' basic rates. Maintaining accuracy on a set of pins within tight accuracy limits becomes very challenging. Methods for valuation of the accuracy of a tester are desirable.

SUMMARY OF THE INVENTION

The description below shows that these challenges are worth every dollar spent on the tester technology. The description starts with assumptions and the theoretical model, then details the results for exemplary Rambus timing parameters and ends with an economic model. The description demonstrates that the impact on the end memory manufacturers' bottom line is too great to be tolerated.

In one form of the invention, methods are provided for comparing a first semiconductor component tester having a first overall tester accuracy with a second semiconductor component tester having a second overall tester accuracy, comprising: calculating actual yield of the first semiconductor component tester for a given set of input parameters; calculating actual yield of the second semiconductor component tester for the given set of input parameters; comparing the actual yield of the first semiconductor component tester with the actual yield of the second semiconductor component tester. The actual yields may be displayed versus tester accuracy. The input parameters may be selected from a group comprising: Ideal Yield, Absolute Limit, Acceptable Defects Per Million, and Tester Edge Placement Accuracy. Economic value of the difference between the calculated actual yield of the first semiconductor component tester and the calculated actual yield of the second semiconductor component tester can be determined.

Also provided in accordance with embodiments of the invention are methods of estimating actual yield of a semiconductor device tester, comprising: setting input parameters, including an acceptable defect rate; assuming a normal distribution of signal edge placement versus time, calculate standard deviation of signal edge placement ($\sigma\_dut$) about the mean signal edge placement ($\mu\_dut$); initializing a test limit; calculating an expected defect rate; and calculating actual yield. The input parameters may further include: Ideal Yield, Absolute Limit, and Tester Edge Placement Accuracy. The methods may also comprise: comparing the expected defect rate with the acceptable defect rate and, if the provisional defect rate differs from the acceptable defect rate, changing the test limit and recalculating the expected defect rate. The input parameters may include an Absolute Limit and initializing the test limit may comprise setting the test limit equal to the Absolute Limit. Calculating actual yield may comprise calculating the probability that a signal edge transition of a semiconductor device will occur within a tester edge uncertainty limit.

Also provided in accordance with embodiments of the invention are computer program products and computer systems with program code for performing such methods.

These and other features consistent with the invention will become apparent to those of skill in the art from the illustrations and description which follow.

BRIEF DESCRIPTION OF THE DRAWING

FIG. 12 is a user interface display showing input parameters and output results in accordance with the invention;

DETAILED DESCRIPTION

The Theory

Tester Accuracy Definition

Tester Overall Timing Accuracy (OTA) is defined as: aggregate timing error comprised of input edge placement accuracy, output edge placement accuracy and input to output timing accuracy. See, for example, SEMI DRAFT DOCUMENT #2928, SPECIFICATION FOR OVERALL DIGITAL TIMING ACCURACY, section 7.1 (SEMI G79-0200 SPECIFICATION FOR OVERALL DIGITAL TIMING ACCURACY, Semiconductor Equipment & Materials International, Mountain View, Calif., §7.1, five pages). The tester's strobe edge distribution inside that window is a function of the tester architecture.

Edge Distributions and Losses:

The DUT valid data window (DUT propagation delay) is a physical parameter that has a certain distribution as a function of the fabrication process and the design.

Figure 1:
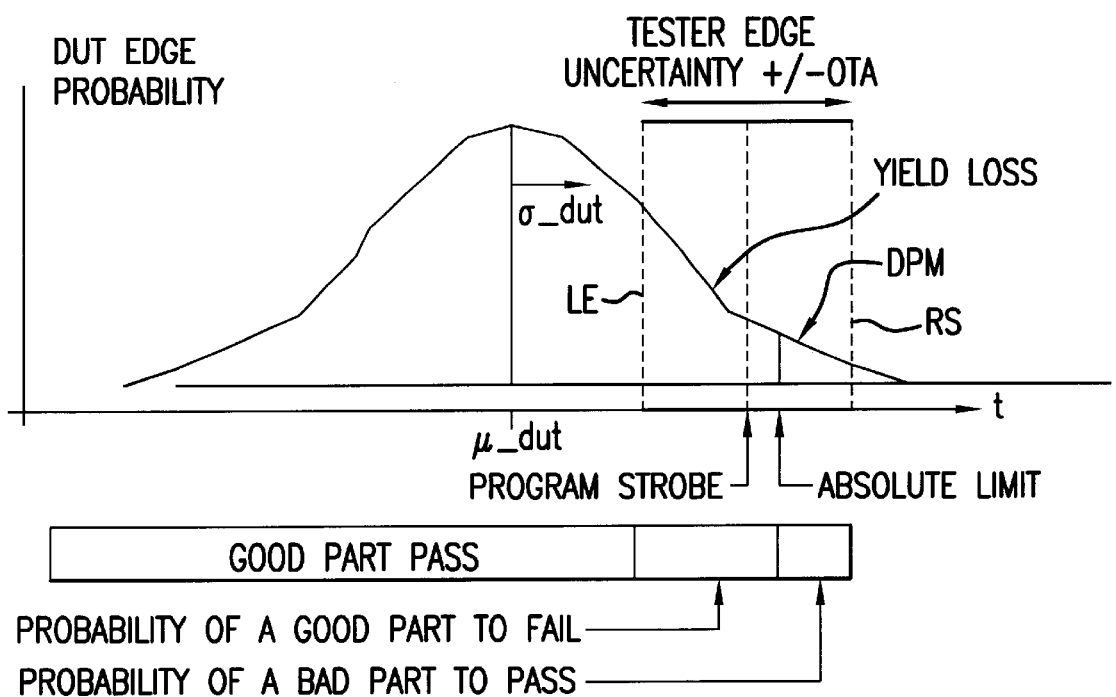
FIG. 1 is a plot showing DUT timing edge distribution and its interaction with tester edge uncertainty window.

FIG. 1 illustrates that distribution as a gaussian bell curve (normally distributed propagation delay with a certain σ). The mean of the DUT propagation delay is defined as $\mu\_dut$, relative to the tester timing reference (T0). The absolute limit (AL), is the maximum acceptable time for the data to be valid. Any transitions occurring to the right of AL are outside of the specification requirements (that is, a bad part relative to the specific speed requirement). The challenge is to program the tester to the optimum limits. In the case of a perfect tester (OTA=0 ps), the test limit is set to the spec limit (AL). The tester strobe edge is not a perfect parameter; it has its own uncertainty region, as wide as the tester's Overall Tester Accuracy (OTA). In reality, the test engineer needs to apply guard-bands for the tester uncertainty area. Program Strobe (PS) is the timing value which the tester edge strobe is programmed for. Note, that the area between AL and the left edge (LE) of the tester uncertainty box represents a probability zone for a good part (faster than AL) to be misjudged by the tester, as the tester compare edge can be more aggressive than AL. This is considered a yield loss. Yield loss is inherently a function of the width of the uncertainty area. To calculate the probability of such an event, we use conditional probability (see equations in Appendix B). The hashed area between AL and the right side (RS) of the uncertainty box for the tester edge reflects a probability zone for bad parts (parts with propagation delay longer than the allowed limit), escaping through as passed parts (since the tester edge strobe might land to the right of the actual edge). These escapes are measured in Defect Per Millions (DPM). An acceptable value for such released defect rate depends on the actual part value and its usage. The more expensive the end application is, the more costly DPMs are for the customer. Note that shifting the test limit to the right (looser guard-banding) means less yield loss, but increases the DPM value. The tester edge placement accuracy translates into the uncertainty box width. The wider the uncertainty area is (lower tester accuracy) the bigger the losses are (in terms of yield and DPM).

Guard-bands:

The purpose of applying a guard-band to a parameter being tested, is to minimize escapes due to tester edge placement inaccuracy. A common method for guard-band is to apply tighter test limits by the OTA value. This in theory moves the tester uncertainty box to the left, as the programmed strobe gets tighter, narrowing the probability of escapes to zero, at the expense of yield.

The Model—Assumptions

DUT Propagation Delay Distribution Model:

Assuming the DUT delay is normally distributed, $X\_dut \sim N(\mu\_dut, \sigma^2\_dut)$, there are two parameters to evaluate: $\mu\_dut$—the average delay, and $\sigma^2\_dut$ the process variance. The average is normalized to be zero, and all parameters referenced to it. To estimate the variance we use the expected process yield to fit a curve and estimate the amount of parts lost due to real performance failures (not test issues).

Figure 2:
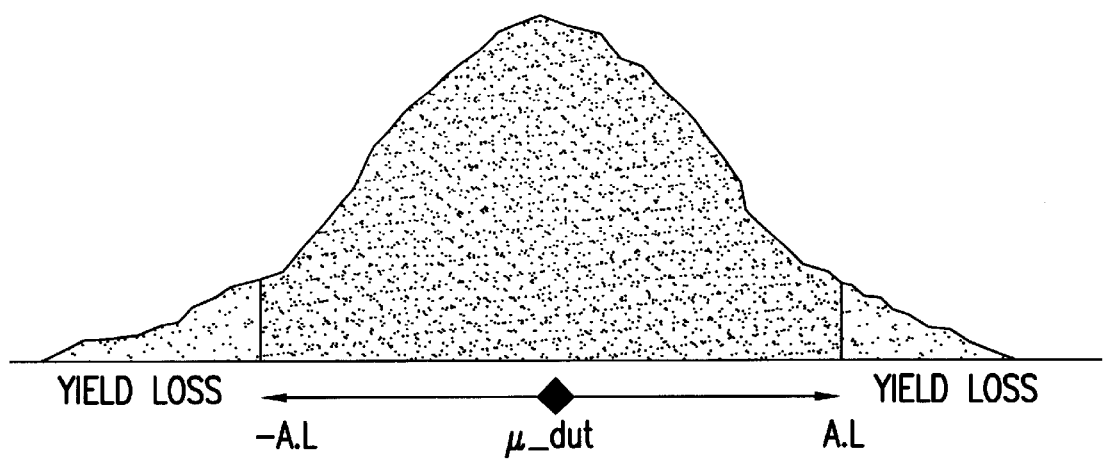
FIG. 2 is a plot showing DUT edge distribution and expected yield.

FIG. 2 is a plot showing DUT edge timing distribution and expected yield, in which the DUT delay $X\_dut \sim N(\mu\_dut, \sigma^2\_dut)$ and the probability density function of $X\_dut$ is f(x), where $\mu\_dut$ is the average delay, and $\sigma^2\_dut$ is the process variance. DUTs having DUT delays outside the limits of −A.L and +A.L are yield losses, as shown in FIG. 2.

Tester Edge Placement Distribution Model:

We model the tester edge to be normally distributed within the OTA window.

$X\_tester \sim N(\mu\_tester, \sigma^2\_tester)$; The Tester edge g(x)—The probability density function of $X\_tester$ $\mu\_tester$: the tester edge placement (tester programmed value)

$\sigma^2\_tester$: the tester edge variance

As ATE specs guarantee that the tester edge lands inside the OTA window, the gaussian function gets cut at the edges. Inside the OTA region, we assume the DUT gaussian distribution has a variance $\sigma\_tester$:

$$3 \times \sigma\_tester = OTA$$

Note that this translates into probability of <1% for the tester edge to get out of the combined uncertainty box (+/−OTA wide). In reality, any tester pin that falls outside of the OTA window is replaced with a better one to guarantee the tester accuracy specs across all pins. Appendix A outlines the relation between tester OTA and the clock and data Edge Placement Accuracy (EPA).

Probability Calculations:

The calculations are outlined in appendix B.

Figure 3:
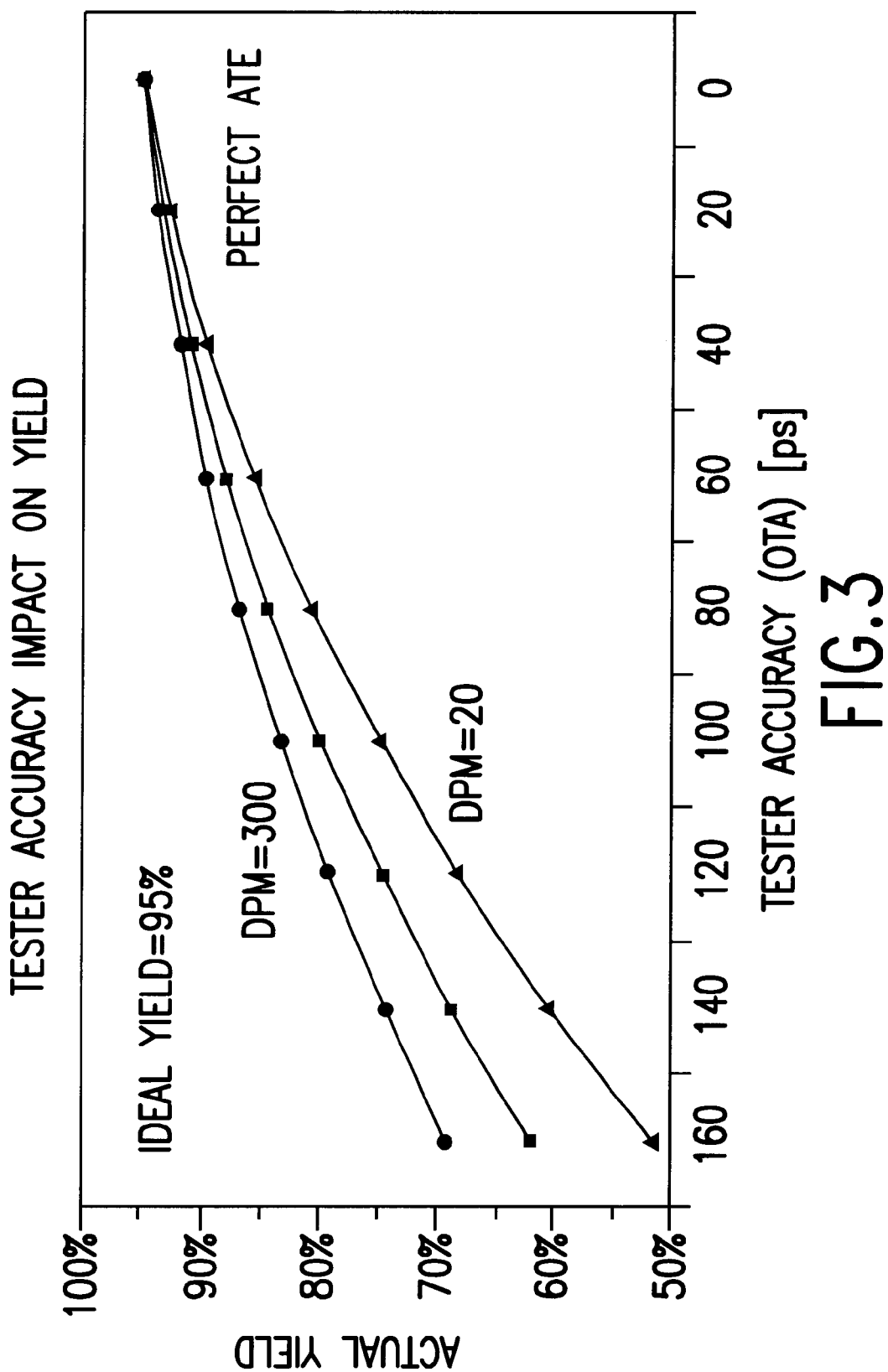
FIG. 3 is a series of plots showing the impact of tester accuracy on yield.

Model Results:

FIG. 3 is a series of plots showing the impact of tester accuracy on yield. FIG. 3 shows the actual yields achieved due to tester accuracy as a function of the tester OTA. Note that the better the accuracy (smaller OTA), the closer the yield gets to the Ideal Yield. The ideal yield is set by the process, and its maturity. We chose the ideal yield to be 95% for the above simulation, and absolute limits to be Tq (table 1 at 800 Mbps). The plots show different DPM points as well. Tighter DPM requirements mean more severe yield impact.

RAMBUS Timing Parameters

Figure 4:
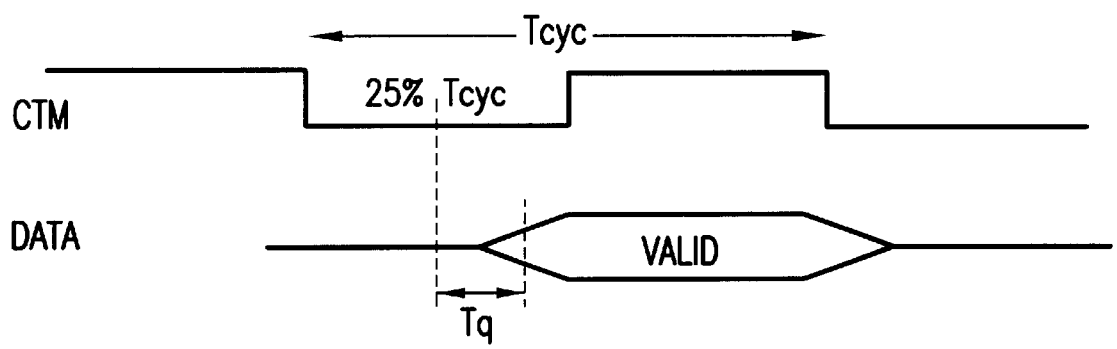
FIG. 4 illustrates the Rambus timing—Tq definition.

The Specification:

In high speed digital parts (high-speed digital semiconductor components), the key timing parameters are: Propagation Delay (specified in Rambus specifications as Tq—see for example Table 21 and FIG. 55 of DIRECT RDRAM™ PRELIMINARY INFORMATION, DOCUMENT DL0035, Version 1.0, Rambus Inc.) and Setup and Hold times (specified as Tsh). The two parameters are sensitive to tester accuracy. Tq is defined as CTM-to-DATA output limit, i.e., the valid window for Rambus Signal Level (RSL) outputs relative to the internal clock CTM (see FIG. 4). FIG. 4 illustrates the Rambus timing—Tq definition.

TABLE 1

| Rambus speed | Tq test limits | | Units |
|---|---|---|---|
| | Min | Max | |
| 600 Mbps | −400 | 400 | ps |
| 800 Mbps | −260 | 260 | ps |

The simulation we used focuses on Tq. However, the same can be applied for Tsh. As Tsh for 800 Mbps data rate is even tighter than Tq (latest Tsh spec is +/−200 ps), the model results here are conservative.

Rambus Yield Simulation Results:

Following the previously explained procedure, we can estimate the actual yields resulting from different testers accuracy. As the expected yields of RDRAM™ parts at 800 Mbps are not clear yet, we strobe the yield impact at different points. Ideal Yield is expected to go up with time as Rambus manufacturing process and design mature. Limiting the DPM to be 300 (an acceptable value in most PC applications), we can plot the yield loss as a function of the tester accuracy (Table 2).

TABLE 2

Actual Yields vs. tester accuracy

| Ideal Yield | OTA = +/−160 ps | OTA = +/−100 ps | OTA = +/−80 ps | OTA = +/−60 ps |
|---|---|---|---|---|
| 60% | 51.67 | 55.3 | 56.4 | 57.5 |
| 75% | 53.3 | 63 | 66 | 68.7 |
| 95% | 69.2 | 83.3 | 86.6 | 89.6 |

The values in bold type (Ideal Yield 95%, OTA=+/−160 ps, actual yield 69.2; Ideal Yield 95%, OTA=+/−100 ps, actual yield 83.3) are used below for the economical evaluations.

Multiple Binning

Currently Rambus speeds are: 800 Mbps and 600 Mbps. Parts that fail at 800 Mbps can be retested against the 600 Mbps specifications. Apparently, missing the 800 Mbps performance due to tester accuracy means lower premium on these parts. The probability calculation needs to be conditioned to the fact that there is another tester edge with a new distribution:

$X\_tester \sim N(\mu\_tester2, \sigma^2\_tester2);$

The Tester edge strobe for 600 Mbps spec

Economical Model:

To translate the above numbers into dollars, we add two new parameters to the equation:

Device Average Selling Price (ASP). ASP value can be either the market value for an 800 Mbps RDRAM part, or the price premium between the two speeds. To be conservative, we shall assume a price premium of $5 between Bin 800 Mbps and Bin 600 Mbps. We also assume that all the parts that fail 800 Mbps, pass the 600 Mbps speed test.

Cost of Escapes: This depends on the actual end application. We won't be able to quantify the escapes impact in dollars, but we will limit the escapes to 300 DPM.

For an ideal yield of 95%, the yield enhancement between testers with a 60 ps OTA difference (160 ps vs 100 ps) was calculated to be 14.1% (see bold values in Table 2). With the forecasted high volumes for the RDRAMs in the coming future, this yield difference translates into major profit difference. For a 100 Million parts produced annually, savings of 14% in yield mean savings of $70M. That is a value of $1.1M for every added pico-second of tester accuracy. The parameters of this example are summarized in the user interface display of FIG. 12 showing input parameters and output results in accordance with an embodiment of the invention.

A different way to look at the numbers is by estimating the savings per tester. Assuming a tester output to be 10 Million parts annually (A typical volume for a memory tester with: 60 sec test time, 32 parts in parallel and 60% utilization), a single tester with 60 ps added accuracy can more than pay for itself in one year.

10E6=14%×$5=$7M

Conclusions:

Better tester accuracy translates into better yield and DPM. A model was given to estimate the potential improvements on both ends, with enhancements to accommodate double binning for the Rambus two proposed speeds (600 Mbps and 800 Mbps). For the forecasted Rambus ASPs, it was shown that every 1 ps of better tester accuracy means an added $1.1M to the bottom line on a 100 Million parts volume.

Appendix A: Tester Accuracy Clarification

Besides the OTA, ATE manufacturers use the term: Edge Placement Accuracy (EPA) for specifying timing accuracy. A single pin edge can have an error of +/−EPA from its programmed value. For a propagation delay measurement Tpd, the two errors need to be considered: Clock input EPA (EPA1), and data output measurement error (EPA2). If the clock input happens at +EPA1 from its programmed value, and the output edge search has an error of +EPA2, the measurement would give Tpd+(EPA1+EPA2). On the other hand, if the clock input lands at −EPA1, while the output edge search has an error of −EPA2, the measurement will result in Tpd−(EPA1+EPA2). Therefore, the total error width of such a measurement is +/−(EPA1+EPA2). The total error was defined earlier as OTA.

$OTA=+/-(EPA1+EPA2)$

In some ATE cases EPA1=EPA2, therefore $OTA=+/-2 \times EPA$

Apparently, improving the clock accuracy (EPA1) can easily improve the overall tester accuracy and reduce losses as shown in the description above:

Appendix B: Probability Calculations

For a propagation delay parameter Tpd, a good part means its edge transition happens faster than the maximum delay allowed. The equations below outline that case. In Rambus specification however, Tq is specified with min and max limits, requiring limits for both ends. In the model, we used two sided limits as well.

Terms:

DUT "Pass": DUT edge<Tester Edge
DUT "Fail": DUT edge>Tester Edge
DUT "Good": DUT edge<Absolute Limit
DUT "Bad": DUT edge>Absolute Limit Ideal Yield $(I.Y) = P(\text{Good}) = P(DUT \text{ edge} < \text{Absolute Limit}) =$ $$\int_{-\infty}^{absolutelimit} f(\text{x\_dut}) d\text{x\_dut}$$

Ideal Loss $(I.L) = 1 - $ Ideal Yield  (B.2)

(B.3) Actual Yield (A.Y)=P(DUT edge<Tester Edge)=

$$\int_{-\infty}^{\infty} g(\text{x\_tester}) \int_{-\infty}^{\text{x\_tester}} f(\text{x\_dut}) d\text{x\_dut} d\text{x\_tester}$$

(B.4) Yield Loss (Y.L)=P(Tester Edge<DUT edg<Absolute Limit)=

$$\int_{-\infty}^{AbsoluteLimit} g(\text{x\_tester}) \int_{\text{x\_tester}}^{AbsolutLimit} f(\text{x\_dut}) d\text{x\_dut} d\text{x\_tester}$$

(B.5) DPM=P(Absolute Limit<DUT edge<Tester Edge Absolute Limit)/(Actual Yield)=

$$\frac{\int_{absolutelimit}^{\infty} g(\text{x\_tester}) \int_{absolutelimit}^{\text{x\_tester}} f(\text{x\_dut}) d\text{x\_dut} d\text{x\_tester}}{ActualYield}$$

Note the relation:

$$I.Y = A.Y - DPM + Y.L \quad (B.6)$$

Appendix C: Simulation Software

Figure 5:
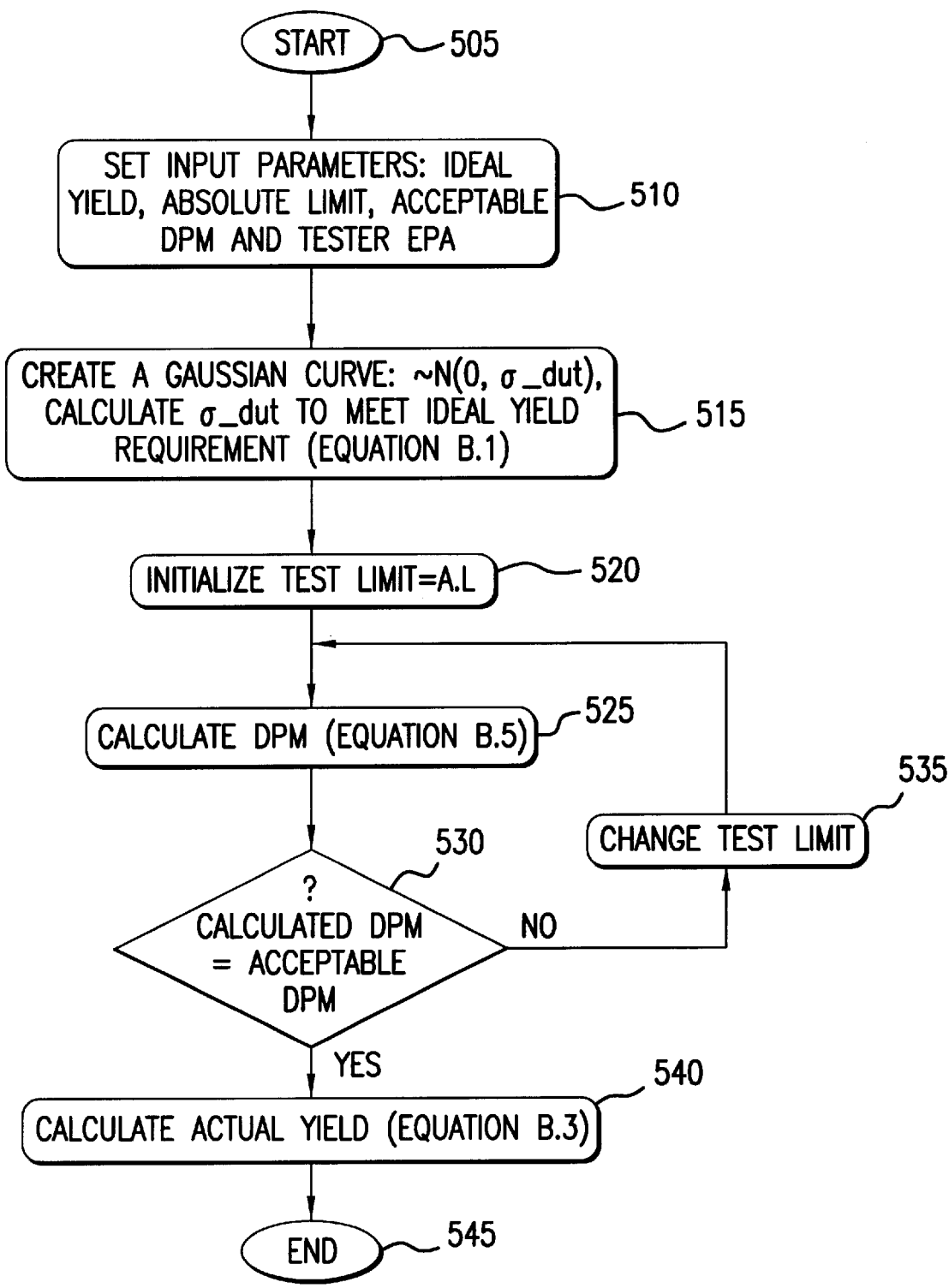
FIG. 5 is a flow chart of an accuracy model algorithm implemented in accordance with the invention.

The accuracy model was implemented using Visual Basic and Excel micro. It involved numerical calculation of integration and parameter solving. FIG. 5 outlines the flow chart of an algorithm implemented in accordance with the invention. The exemplary flow chart of FIG. 5 provides for calculation of yields as follows:

Step 505: Start

Step 510: Set Input Parameters: Ideal Yield (I.Y), Absolute Limit (A.L), Acceptable
Defects Per Million (DPM) and Tester Edge-Placement Accuracy (EPA)

Step 515: Create a gaussian curve: ~N(0, σ_dut), Calculate σ_dut to meet Ideal
Yield requirement (Equation B.1)

Step 520: Initialize: Test Limit=A.L

Step 525: Calculate DPM (Equation B.5)

Step 530: Determine whether Calculated DPM= Acceptable DPM
If No, proceed to step 535
If Yes, proceed to step 540

Step 535: Change Test Limit, then return to step 525

Step 540: Calculate Actual Yield (Equation B.3)

Step 545: End

Additional Discussion

Those of skill in the art will recognize that the method described provides a quantifiable measure of the relationship between tester edge placement accuracy and manufacturing cost of semiconductor devices under test. A sample case with Rambus RDRAM devices is presented, though the method is applicable to other devices as well. Data rates are estimated where accuracy matters.

Figure 6:
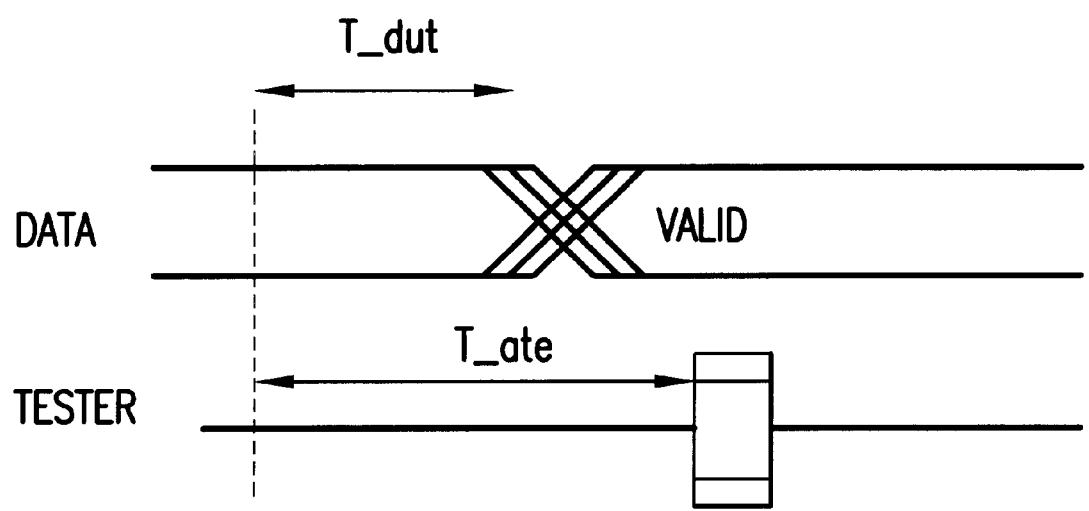
FIG. 6 illustrates the relationship between DUT propagation delay ($T\_dut$) and tester strobe edge location ($T\_ate$)

As shown in FIG. 6, DUT propagation delay (T_dut) is a physical parameter that has a certain distribution. Tester strobe edge location (T_ate) has an uncertainty region measured by Overall Tester Accuracy (OTA).

Figure 7:
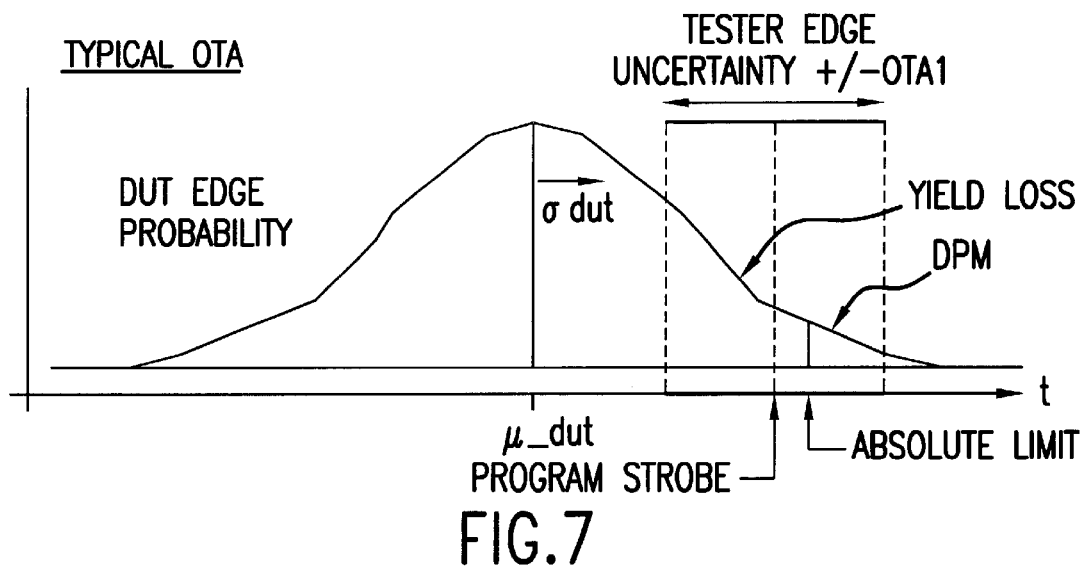
FIG. 7 illustrates the DUT edge probability, yield loss and DPM for a typical OTA.
Figure 8:
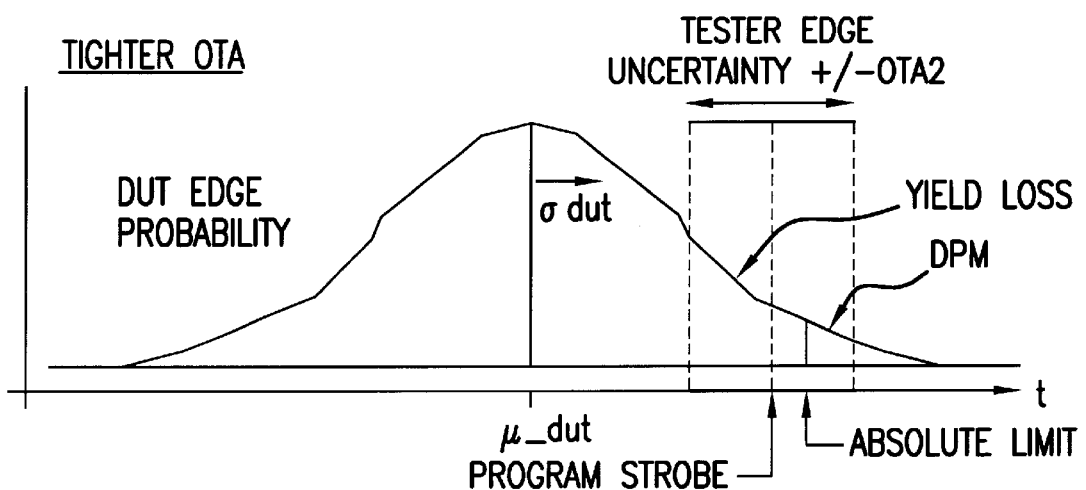
FIG. 8 illustrates the DUT edge probability, yield loss and DPM for an OTA which is less than that of FIG. 7.
Figure 9:
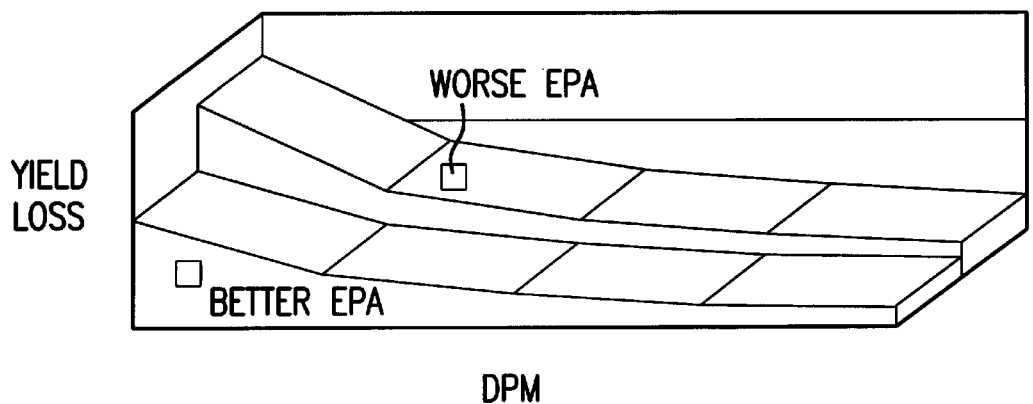
FIG. 9 illustrates the effect of relaxing the test limit with plots of yield loss vs. DPM for two different edge-placement-accuracy values.

FIG. 7 illustrates the DUT edge probability, yield loss and DPM for a typical OTA. FIG. 8 illustrates the DUT edge probability, yield loss and DPM for an OTA which is less than that of FIG. 7. A comparison of FIGS. 7 and 8 shows that lower tester accuracy means a wider tester-edge-uncertainty box, which means higher Yield Loss and higher DPM. Loosening the Test Limit moves the tester-edge-uncertainty box to the right, producing higher yield but increased DPM. FIG. 9 graphically illustrates with plots of yield loss vs. DPM, assuming two different edge-placement-accuracy values. As shown in the examples of FIG. 9, both yield loss and DPM improve with better edge-placement accuracy.

Figure 10:
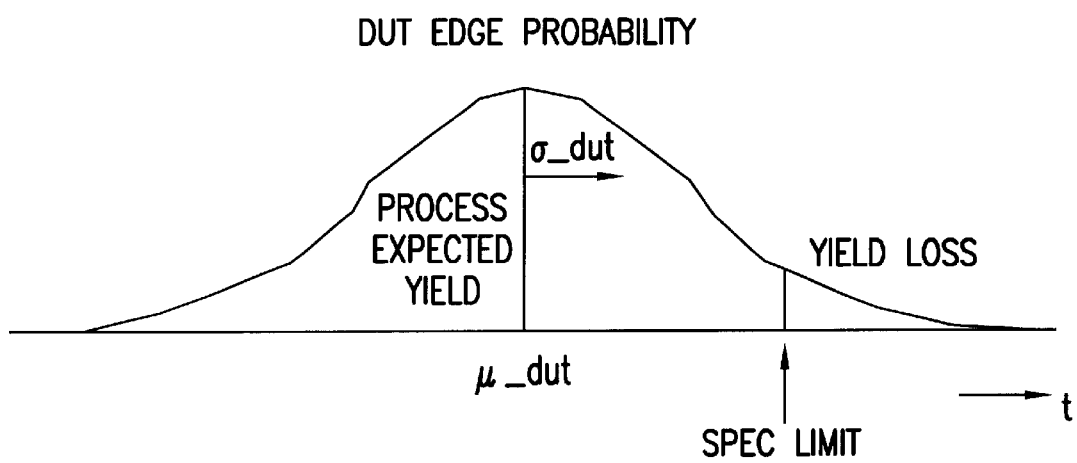
FIG. 10 shows a plot of DUT edge-placement probability relative to timing specification limit.

FIG. 10 shows a plot of DUT edge-placement probability relative to timing specification limit. Devices performing within the Spec Limit are within the process expected yield; those performing outside the Spec Limit are considered Yield Loss. For DUT modeling, DUT timing (propagation delay) is normally distributed across the Silicon process Tpd~N($\mu$_dut, σ_dut); $\mu$_dut=0. DUT expected yield based on the specific timing parameter determines the process distribution σ_dut.

Figure 11:
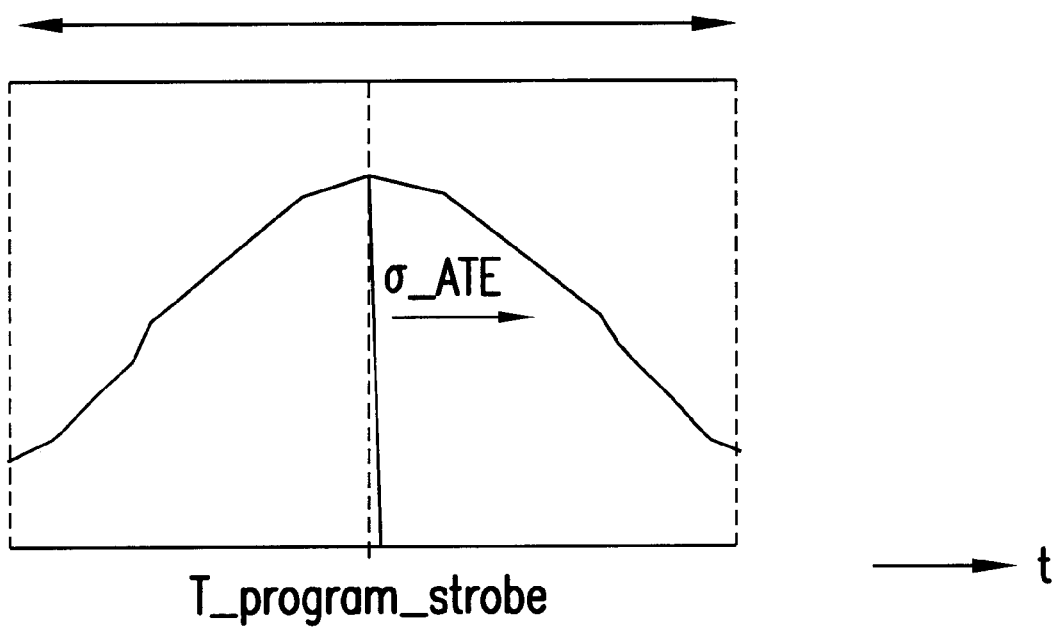
FIG. 11 illustrates the modeling of tester edge placement in accordance with the invention.

Tester edge placement can be modeled as shown in FIG. 11, wherein:

tester-edge-placement distribution model is normal: T_program_strobe~N($\mu$_ate, $\mu$_ate) within the uncertainty window of width (2×OTA)

σ_ate is determined by: 2×OTA=6×$\mu$_ate

OTA=2×Edge Placement Accuracy

Figure 13:
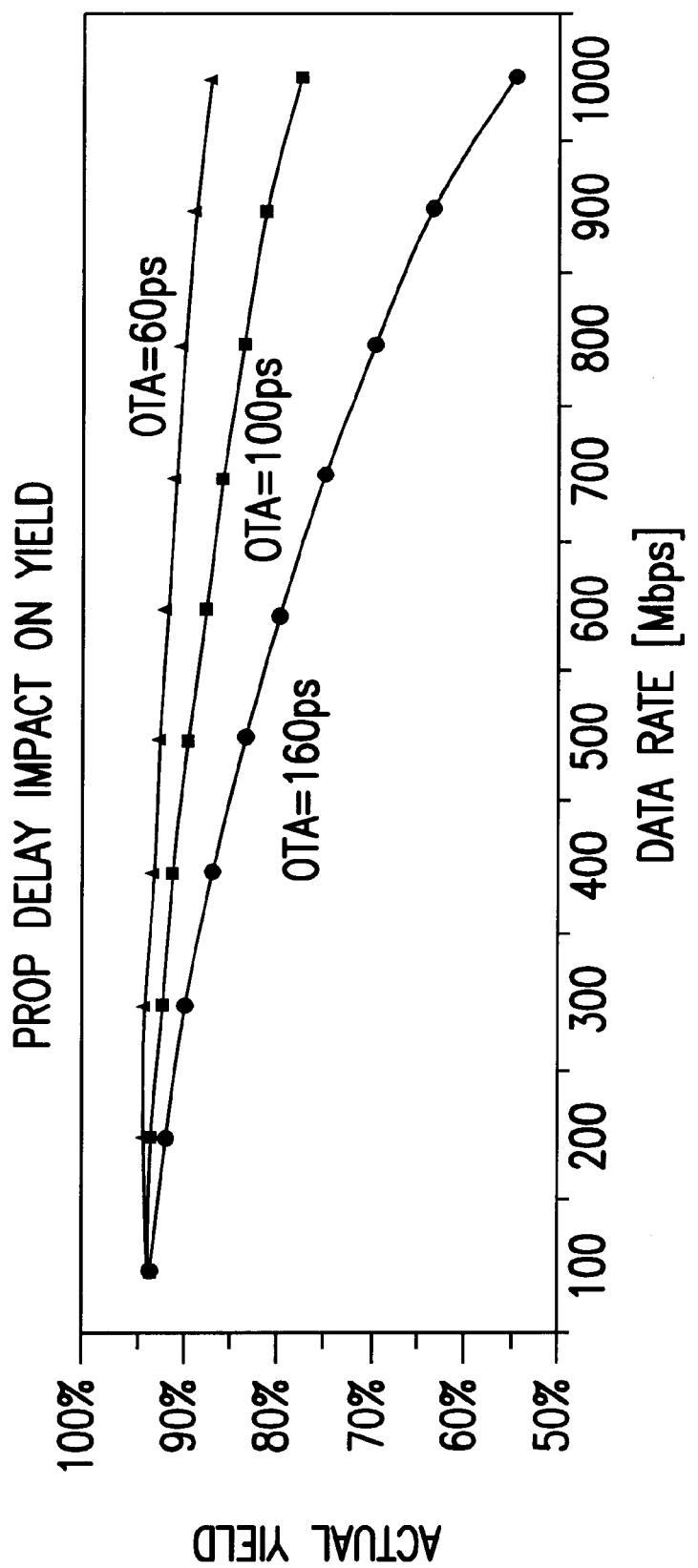
FIG. 13 illustrates the impace of accuracy on yield as a result of increased data rates.

FIG. 13 illustrates the impact of accuracy on yield as a result of increased data rates. The plots assume propagation delay Tpd is at 20% ratio from Tui [Tq:Tui=260 ps: 1.25 ns].

Figure 14:
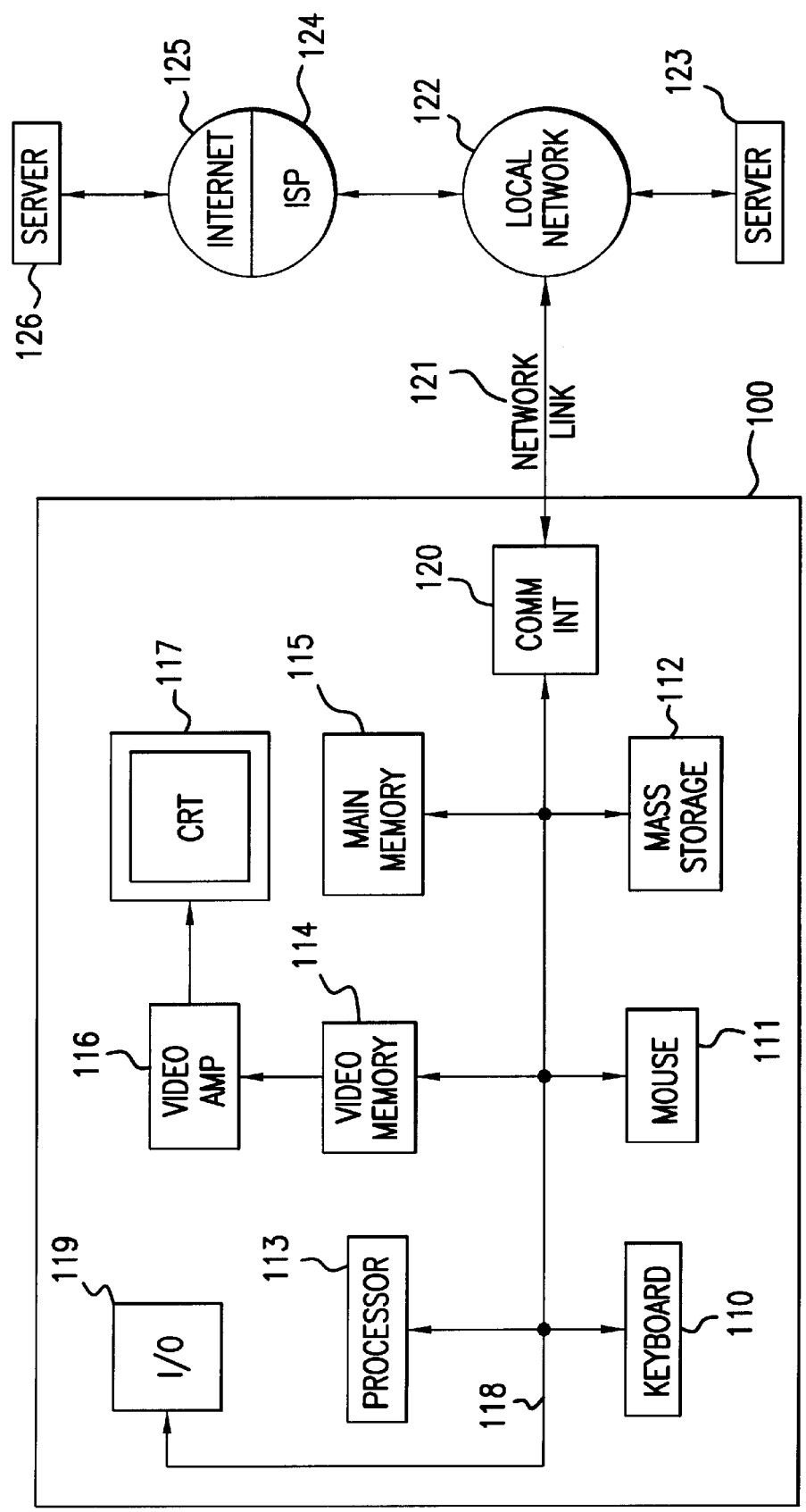
FIG. 14 is a block diagram of a general purpose computer system suitable for executing computer software in the form of computer readable code for performing methods in accordance with embodiments of the invention.

An embodiment of the invention can be implemented as computer software in the form of computer readable code executed on a general purpose computer such as computer 100 illustrated in FIG. 14. A keyboard 110 and mouse 111 are coupled to a bidirectional system bus 118. The keyboard and mouse are for introducing user input to the computer system and communicating that user input to processor 113. Other suitable input devices may be used in addition to, or in place of, the mouse 111 and keyboard 110. Input-output (I/O) units 119 coupled to bidirectional system bus 118 represents such I/O elements as a printer, audio/video (A/V) input/output devices, etc.

Computer 100 includes a video memory 114, main memory 115 and mass storage 112, all coupled to bidirectional system bus 118 along with keyboard 110, mouse 111 and processor 113. The mass storage 112 may include both fixed and removable media, such as magnetic, optical or magnetic optical storage systems or any other available mass storage technology. Bus 118 may contain, for example, thirty-two address lines for addressing video memory 114 or main memory 115. The system bus 118 also includes, for example a 32-bit data bus for transferring data between and among the components, such as processor 113, main memory 115, video memory 114 and mass storage 112. Alternatively, multiplex data/address lines may be used instead of separate data and address lines.

In one embodiment of the invention, the processor 113 is a microprocessor manufactured by Motorola, such as the 680x0 processor or a microprocessor manufactured by Intel, such as the 80x86, or Pentium processor, or a SPARC™ microprocessor from Sun Microsystems, Inc. However, any other suitable microprocessor or microcomputer may be utilized. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT)

raster monitor 117, and serves to convert pixel data stored in video memory 114 to a raster signal suitable for use by monitor 117. Monitor 117 is a type of monitor suitable for displaying graphic images.

Computer 100 may also include a communication interface 120 coupled to bus 118. Communication interface 120 provides a two-way data communication coupling via a network link 121 to a local network 122. For example, if communication interface 120 is an integrated services digital network (ISDN) card or a modem, communication interface 120 provides a data communication connection to the corresponding type of telephone line, which comprises part of network link 121. If communication interface 120 is a local area network (LAN) card, communication interface 120 provides a data communication connection via network link 121 to a compatible LAN. Wireless links are also possible. In any such implementation, communication interface 120 sends and receives electrical, electromagnetic or optical signals which carry digital data streams representing various types of information.

Network link 121 typically provides data communication through one or more networks to other data devices. For example, network link 121 may provide a connection through local network 122 to local server computer 124 or to data equipment operated by an Internet Service Provider (ISP) 124. ISP 124 in turn provides data communication services through the work wide packet data communication network now commonly referred to as the "Internet" 125. Local network 122 and Internet 125 both use electrical, electromagnetic or optical signals which carry digital data streams. The signals through the various networks and the signals on network link 121 and through communication interface 120, which carry the digital data to and from computer 100, are exemplary forms of carrier waves transporting the information.

Computer 100 can send messages and receive data, including program code, through the network(s), network link 121, and communication interface 120. In the Internet example, remote server computer 126 might transmit a requested code for an application program through Internet 125, ISP 124, local network 122 and communication interface 120. In accord with the invention, such an application program may be suitable performing methods described herein. The received code may be executed by processor 113 as it is received, and/or stored in mass storage 112, or other non-volatile storage for later execution. In this manner, computer 100 may obtain application code in the form of a carrier wave.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, carrier waves and digital signals.

The computer systems described above are for purposes of example only. An embodiment of the invention may be implemented in any type of computer system or programming or processing environment.

RAMBUS, RDRAM and RIMM are trademarks of Rambus Inc., Mountain View, Calif. USA.

Those of skill in the art will recognize that these and other modifications can be made within the spirit and scope of the invention as defined in the claims.

What is claimed is:

1. A method of comparing a first semiconductor component tester having a first overall tester accuracy with a second semiconductor component tester having a second overall tester accuracy, comprising:
   a. Calculating actual yield of the first semiconductor component tester for a given set of input parameters;
   b. Calculating actual yield of the second semiconductor component tester for the given set of input parameters;
   c. Comparing the actual yield of the first semiconductor component tester with the actual yield of the second semiconductor component tester.

2. The method of claim 1, further comprising the step of displaying the actual yields versus tester accuracy.

3. The method of claim 1, wherein the input parameters are selected from a group comprising: Ideal Yield, Absolute Limit, Acceptable Defects Per Million, and Tester Edge Placement Accuracy.

4. The method of claim 1, further comprising the step of determining economic value of the difference between the calculated actual yield of the first semiconductor component tester and the calculated actual yield of the second semiconductor component tester.

5. A method of estimating actual yield of a semiconductor device tester, comprising:
   a. setting input parameters, including an acceptable defect rate;
   b. assuming a normal distribution of signal edge placement versus time, calculate standard deviation of signal edge placement ($\sigma\_dut$) about the mean signal edge placement ($\mu\_dut$);
   c. initializing a test limit;
   d. calculating an expected defect rate; and
   e. calculating actual yield.

6. The method of claim 5, wherein the input parameters further include at least one of: Ideal Yield, Absolute Limit, and Tester Edge Placement Accuracy.

7. The method of claim 5, further comprising: comparing the expected defect rate with the acceptable defect rate and, if the expected defect rate differs from the acceptable defect rate, changing the test limit and recalculating the expected defect rate.

8. The method of claim 5, wherein the input parameters in an Absolute Limit and wherein initializing the test limit comprises setting the test limit equal to the Absolute Limit.

9. The method of claim 5, wherein calculating actual yield comprises calculating a probability that a signal edge transition of a semiconductor device will occur within a tester edge uncertainty limit.

10. A computer program product for comparing a first semiconductor component tester having a first overall tester accuracy with a second semiconductor component tester having a second overall tester accuracy, comprising:
   a. instructions for calculating actual yield of the first semiconductor component tester for a given set of input parameters;
   b. instructions for calculating actual yield of the second semiconductor component tester for the given set of input parameters; and
   c. instructions for comparing the actual yield of the first semiconductor component tester with the actual yield of the second semiconductor component tester.

11. A computer system for comparing a first semiconductor component tester having a first overall tester accuracy with a second semiconductor component tester having a second overall tester accuracy, comprising:
   a. Program code for calculating actual yield of the first semiconductor component tester for a given set of input parameters;

b. Program code for calculating actual yield of the second semiconductor component tester for the given set of input parameters; and c. Program code for comparing the actual yield of the first semiconductor component tester with the actual yield of the second semiconductor component tester.

12. An article of manufacture comprising a computer readable medium encoded with a computer program for comparing a first semiconductor component tester having a first overall tester accuracy with a second semiconductor component tester having a second overall tester accuracy, the computer program comprising:

a. Instructions for calculating actual yield of the first semiconductor component tester for a given set of input parameters;

b. Instructions for calculating actual yield of the second semiconductor component tester for the given set of input parameters;

c. Instructions for comparing the actual yield of the first semiconductor component tester with the actual yield of the second semiconductor component tester.

13. A computer program product for estimating actual yield of a semiconductor device tester, comprising:

a. Instructions for setting input parameters, including an acceptable defect rate;

b. Instructions for calculating standard deviation of signal edge placement ($\sigma\_dut$) about the mean signal edge placement ($\mu\_dut$), assuming a normal distribution of signal edge placement versus time;

c. Instructions for initializing a test limit;

d. Instructions for calculating an expected defect rate; and e. Instructions for calculating actual yield.

* * * * *